(12) United States Patent
Medoff

(10) Patent No.: US 10,410,453 B2
(45) Date of Patent: Sep. 10, 2019

(54) MARKING PLASTIC-BASED PRODUCTS

(71) Applicant: Xyleco, Inc., Wakefield, MA (US)

(72) Inventor: Marshall Medoff, Brookline, MA (US)

(73) Assignee: Xyleco, Inc., Wakefield, MA (US)

( * ) Notice: Subject to any disclaimer, the term of this patent is extended or adjusted under 35 U.S.C. 154(b) by 0 days.

(21) Appl. No.: 14/897,958

(22) PCT Filed: Jul. 7, 2015

(86) PCT No.: PCT/US2015/039341
§ 371 (c)(1),
(2) Date: Dec. 11, 2015

(87) PCT Pub. No.: WO2016/007484
PCT Pub. Date: Jan. 14, 2016

(65) Prior Publication Data
US 2016/0210803 A1    Jul. 21, 2016

Related U.S. Application Data

(60) Provisional application No. 62/021,823, filed on Jul. 8, 2014.

(51) Int. Cl.
*G07D 7/12* (2016.01)
*B42D 25/41* (2014.01)
(Continued)

(52) U.S. Cl.
CPC ............ *G07D 7/12* (2013.01); *B29C 35/0805* (2013.01); *B29C 35/0866* (2013.01);
(Continued)

(58) Field of Classification Search
CPC ......... G07D 7/12; G07D 7/0054; C08J 7/123; C08J 2323/12; D21H 21/48;
(Continued)

(56) References Cited

U.S. PATENT DOCUMENTS 1,575,940 A    3/1926    Sawyer
3,266,972 A    8/1966    Cramer et al.
(Continued)

FOREIGN PATENT DOCUMENTS

CA    995274    8/1976
CN    101137898    3/2008
(Continued)

OTHER PUBLICATIONS

International Search Report and Written Opinion for International Patent Application No. PCT/US2015/039341 dated Dec. 11, 2015 (15 pages).
(Continued)

*Primary Examiner* — David P Porta
*Assistant Examiner* — Gisselle M Gutierrez
(74) *Attorney, Agent, or Firm* — Leber IP Law; Celia H. Leber

(57) ABSTRACT

Methods of marking plastic-based products and marked plastic-based products are provided. Some methods include irradiating the product to alter the functionalization of the plastic. In general, the present disclosure features methods of marking substrates, e.g., substrates including plastics, such as plastic-based products, such as polymer banknotes. Such plastics can be rigid or flexible, e.g., elastomeric. Such plastics can be thermoplastic or thermosets. In some cases, the products are marked by irradiating plastic-based materials, e.g., sheet materials, under conditions that alter characteristics of the irradiated plastic.

11 Claims, 3 Drawing Sheets

(51) Int. Cl.

| | | |
|---|---|---|
| *B42D 25/29* | (2014.01) | |
| *D21H 21/48* | (2006.01) | |
| *H01J 37/317* | (2006.01) | |
| *C08J 7/12* | (2006.01) | |
| *G07D 7/005* | (2016.01) | |
| *B29C 71/04* | (2006.01) | |
| *B29C 35/08* | (2006.01) | |
| *B29C 59/16* | (2006.01) | |
| *B42D 25/405* | (2014.01) | |
| *C08J 7/06* | (2006.01) | |
| *B32B 5/14* | (2006.01) | |
| *B32B 7/12* | (2006.01) | |
| *B32B 27/08* | (2006.01) | |
| *B32B 27/16* | (2006.01) | |
| *B32B 27/20* | (2006.01) | |
| *B32B 27/32* | (2006.01) | |
| *B29C 71/00* | (2006.01) | |
| *B29K 23/00* | (2006.01) | |

(52) U.S. Cl.
CPC ............ *B29C 59/16* (2013.01); *B29C 71/04* (2013.01); *B32B 5/147* (2013.01); *B32B 7/12* (2013.01); *B32B 27/08* (2013.01); *B32B 27/16* (2013.01); *B32B 27/20* (2013.01); *B32B 27/32* (2013.01); *B42D 25/29* (2014.10); *B42D 25/405* (2014.10); *B42D 25/41* (2014.10); *C08J 7/06* (2013.01); *C08J 7/123* (2013.01); *D21H 21/48* (2013.01); *G07D 7/0054* (2017.05); *H01J 37/3171* (2013.01); *B29C 71/0063* (2013.01); *B29C 2035/085* (2013.01); *B29C 2035/0872* (2013.01); *B29C 2035/0877* (2013.01); *B29K 2023/00* (2013.01); *B29K 2023/12* (2013.01); *B29K 2995/0092* (2013.01); *B32B 2250/02* (2013.01); *B32B 2250/242* (2013.01); *B32B 2255/10* (2013.01); *B32B 2262/062* (2013.01); *B32B 2262/065* (2013.01); *B32B 2262/067* (2013.01); *B32B 2262/101* (2013.01); *B32B 2262/103* (2013.01); *B32B 2262/106* (2013.01); *B32B 2264/102* (2013.01); *B32B 2264/104* (2013.01); *B32B 2264/105* (2013.01); *B32B 2264/108* (2013.01); *B32B 2307/4023* (2013.01); *B32B 2307/41* (2013.01); *B32B 2307/518* (2013.01); *B32B 2310/08* (2013.01); *B32B 2425/00* (2013.01); *B32B 2554/00* (2013.01); *C08J 2323/12* (2013.01); *H01J 2237/31701* (2013.01)

(58) Field of Classification Search
CPC ........ H01J 37/3171; H01J 2237/31701; B42D 25/29; B42D 25/41
USPC ........................................................ 250/340
See application file for complete search history.

(56) References Cited

U.S. PATENT DOCUMENTS

| | | |
|---|---|---|
| 3,266,973 A | 8/1966 | Crowley |
| 3,535,137 A | 10/1970 | Haller et al. |
| 3,759,942 A | 9/1973 | Himics |
| 3,962,054 A | 6/1976 | Wattiez et al. |
| 4,138,522 A | 2/1979 | Ishizuka et al. |
| 4,248,500 A | 2/1981 | Pernicano et al. |
| 4,486,585 A | 12/1984 | Turnunen et al. |
| 4,660,859 A | 4/1987 | Natesh |
| 5,275,870 A | 1/1994 | Halope et al. |
| 6,020,278 A | 2/2000 | Gatenholm |
| 6,264,791 B1 | 7/2001 | Sun et al. |
| 6,432,844 B1 | 8/2002 | Farrar |
| 6,592,949 B1 | 7/2003 | Polke et al. |
| 6,638,579 B2 | 10/2003 | Ross et al. |
| 6,827,967 B2 | 12/2004 | Besnard |
| 6,872,927 B2 | 3/2005 | Geisler et al. |
| 6,958,108 B1 | 10/2005 | Vuorinen |
| 7,052,730 B2 | 5/2006 | Patel |
| 7,274,458 B2 | 9/2007 | Perez et al. |
| 7,847,358 B2 | 12/2010 | Doris |
| 7,867,358 B2 | 1/2011 | Medoff |
| 8,052,838 B2 | 11/2011 | Medoff |
| 8,278,244 B2 | 10/2012 | Stubbs |
| 8,622,433 B2 | 1/2014 | Depta et al. |
| 8,975,052 B2 | 3/2015 | Medoff |
| 8,980,600 B2 | 3/2015 | Medoff |
| 8,980,601 B2 | 3/2015 | Medoff |
| 8,986,967 B2 | 3/2015 | Medoff |
| 9,342,715 B2 | 5/2016 | Medoff |
| 2006/0131425 A1 | 6/2006 | Stenzel et al. |
| 2006/0169427 A1 | 8/2006 | Cartier |
| 2009/0117353 A1 | 5/2009 | Stubbs et al. |
| 2009/0134749 A1 | 5/2009 | Nakamura et al. |
| 2009/0134764 A1 | 5/2009 | Kameda et al. |
| 2009/0283229 A1 | 11/2009 | Medoff |
| 2010/0206501 A1 | 8/2010 | Medoff |
| 2010/0297720 A1 | 11/2010 | Medoff et al. |
| 2010/0304440 A1 | 12/2010 | Medoff |
| 2011/0081335 A1 | 4/2011 | Medoff |
| 2011/0081336 A1 | 4/2011 | Medoff |
| 2011/0111456 A1 | 5/2011 | Medoff |
| 2011/0139383 A1 | 6/2011 | Medoff |
| 2012/0003704 A1 | 1/2012 | Medoff |
| 2012/0024965 A1 | 2/2012 | Kawae et al. |
| 2012/0168506 A1 | 7/2012 | Ruehrmair et al. |
| 2012/0285639 A1 | 11/2012 | Medoff |
| 2012/0285647 A1 | 11/2012 | Medoff |
| 2013/0115449 A1 | 5/2013 | Busardo |
| 2015/0151866 A1* | 6/2015 | Oral ........................ A61L 27/16 53/425 |

FOREIGN PATENT DOCUMENTS

| | | |
|---|---|---|
| CN | 102576187 | 7/2012 |
| CN | 103003340 | 3/2013 |
| DE | 102006038270.6 | 2/2008 |
| EP | 1215216 | 6/2002 |
| EP | 2181858 | 5/2010 |
| GB | 1147490 | 4/1969 |
| JP | S57-89687 | 6/1982 |
| JP | S60110380 | 6/1985 |
| JP | 3-008898 | 1/1991 |
| JP | H04238098 A | 8/1992 |
| JP | H04372743 | 12/1992 |
| JP | H09204553 | 8/1997 |
| JP | H106044 A | 1/1998 |
| JP | 2000094863 | 4/2000 |
| JP | 2000286249 | 10/2000 |
| JP | 2002162335 | 6/2002 |
| JP | 2003010985 A | 1/2003 |
| JP | 2003017466 | 1/2003 |
| JP | 2003067712 A | 3/2003 |
| JP | 2005259353 | 9/2005 |
| JP | 2005538350 | 12/2005 |
| JP | 2007105732 A | 4/2007 |
| JP | 2008162232 | 7/2008 |
| JP | 2008213242 | 9/2008 |
| JP | 2009013204 | 1/2009 |
| JP | 2013508567 A | 3/2013 |
| JP | 2014514177 A | 6/2014 |
| WO | 0198616 | 12/2001 |
| WO | 2005065956 | 7/2005 |
| WO | 2007045912 | 4/2007 |
| WO | 2008017300 | 2/2008 |
| WO | 2008073186 | 6/2008 |
| WO | 2008143002 | 11/2008 |
| WO | 2010026407 | 3/2010 |
| WO | 2010028758 | 3/2010 |
| WO | 2011046973 | 4/2011 |
| WO | 2013170005 | 11/2013 |

(56) References Cited

FOREIGN PATENT DOCUMENTS

OTHER PUBLICATIONS

Extended European Search Report dated Jan. 26, 2018, issued by the European Patent Office in related EP Application No. 15818137.0 (8 pages).
Search Report—Corresponding Chinese Application No. 2015800337018, dated Jan. 3, 2018, 3 pages.
Bouchard J., et al., "The Effects of Ionizing Radiation on the Cellulose of Woodfree Paper" Cellulose, (2006), vol. 13, pp. 601-610.
Adamo, M. and Magaudda, G. "Susceptibility of Printed Paper to Attack of Chewing Insects After Gamma Irradiation and Ageing", 2002, url:www.viks.sk/chk/res_2_03_95_105.doc, 2002, retrieved Jun. 12, 2013, 8 pages.
Ferrero, F.; Testore, F; Tonin, C; Innocenti, R., "Surface Degradation of Linen Textiles Induced by Laser Treatment: Comparison with Electron Beam and Heat Source" AUTEX Res. J., Sep. 2002, 2(3), pp. 109-114.
Whatman "Protran Nitrocellulose Membranes" Proteomics and Glycomics Brochure, TOPAS-BS, 2004, 6 pages.
Stevens, Malcolm P., "Evaluation, Characterization, and Analysis of Polymers" Polymer Chemistry: An Introduction, 3rd Ed., 1999, Chapter 5, pp. 129-166.
Fahey, Mary, "The Care and Preservation of Archival Materials" The Henry Ford—URL: http://www.thehenryford.org/research/caring/materials.aspx, 2000, accessed online Dec. 5, 2012, 6 pages.
Muto, Naoichi; Takahashi, Kimiya; Yamazaki, Hidehiko "Effect of Electron Beam Irradiation on Characteristics of Paper" Japan Tappi Journal,1995, 49(7), p. 1086-1097. ://doi.org/10.2524/jtappij.49.1086.
Su Yuchang et al., Effect of γ-Ray Irradiation on Physical and Chemical Properties of Paper, Taiwan Forestry Science, Issue 2 of vol. 14, pp. 119-130, 1999.
Search Report—Corresponding Chinese Application No. 2016105863891, dated Nov. 23, 2017, 2 pages.
Office Action—Corresponding Chinese Application No. 2016105863891, dated Dec. 1, 2017, 5 pages.
Carter Ha, "The Chemistry of Paper Preservation", J. Chem. Ed. 1996, 73(5), 417-420.
Office Action, Corresponding CN Application No. 2016105863891, dated Apr. 27, 2017, 4 pages.
Office Action—Corresponding European Application No. 10823969, dated Oct. 31, 2016, 6 pages.
Moreau, V "NOTAMARK—Industrial Laser Marking System, A New Security Marking Technology" Optical Security and Counterfeit Deterrence Techniques V, Rudolf L. van Renesse (ed.), Proc. of SPIE-IS&T Electronic Imaging, SPIE vol. 5310, p. 194-201.doi:10.1117/12.525666.
D'Halluin, M; J. Rull-Barrull; E. Le Grognec; D. Jacqueminab; Felpin, F-X "Writing and erasing hidden optical information on covalently modified cellulose paper" Chem. Comm.,2016, 52, 7672-7675. DOI: 10.1039/c6cc02915a.
Examination Report—Corresponding AU Application No. 2017232237, dated May 15, 2018, 3 pages.

* cited by examiner

MARKING PLASTIC-BASED PRODUCTS

CROSS-REFERENCE TO RELATED APPLICATIONS

This application is a National Stage entry of PCT International Application No. PCT/US15/39341 filed Jul. 7, 2015, which claims the benefit of U.S. Provisional Application No. 62/021823 filed Jul. 8, 2014, the content of which is hereby incorporated by reference.

TECHNICAL FIELD

This invention relates to methods and systems for marking plastic-based products, e.g., products including plastic substrates such as plastic-based sheet materials. Plastic substrates are used in a wide variety of products, including currency, identification cards, and credit cards, and products produced by such methods and systems.

BACKGROUND

Plastic-based sheet materials, e.g., sheet materials formed of plastic, plastic fibers, or blends of plastic and other materials, and laminates of such materials with other types of sheet materials, are used for packaging, currency, identification cards, passports, credit cards, and many other applications. When such materials are used in currency, the currency is often referred to as "polymer banknotes."

In some applications, for example when these sheet materials are used as currency, in credit cards, and in other financial applications, it is often desirable to be able to "mark" or "tag" the sheet material with a special marking that is not visible to the naked eye, and/or cannot easily be produced by counterfeiters. Marking can be used, for example, to prevent or detect counterfeiting. Marking can also be used on currency to allow the currency to be traced and/or identified, e.g., if it is stolen or used in a criminal transaction.

SUMMARY

In general, the present disclosure features methods of marking substrates, e.g., substrates including plastics, such as plastic-based products, such as polymer banknotes. Such plastics can be rigid or flexible, e.g., elastomeric. Such plastics can be thermoplastic or thermosets. In some cases, the products are marked by irradiating plastic-based materials, e.g., sheet materials, under conditions that alter characteristics of the irradiated plastic. This alteration makes the plastic-based product distinguishable, e.g., by infrared spectrometry (IR), electron paramagnetic resonance (EPR), atomic force microscopy (AFM), or other techniques, from a similar appearing product that has not been irradiated. In some cases, the irradiated product is also distinguishable from a similar appearing product that has been irradiated, but under different process conditions.

In other implementations, the products are marked using ion implantation, e.g., sputtering of the plastic-based material with metals. The metals may be metals that are unusual in the environment, and are preferably non-toxic at the levels and under the conditions employed in the marking process.

In some implementations, the marking is invisible to the naked eye, e.g., it is detected by the use of instruments. In other implementations, the marking is visible to the naked eye. Generally, the marking is difficult to replicate without relatively sophisticated equipment, thereby making counterfeiting more difficult.

Characteristics of the plastic that can be altered by irradiation include, for example, molecular weight, molecular structure, degree of cross-linking or polymerization, polarity, and functionalization. By "functionalization," we mean the functional groups that are present on or within the plastic.

In one aspect, the invention features methods of making a marked product. Some methods include irradiating a plastic-based sheet material under conditions selected to alter the characteristics, e.g., the functionalization, of a discrete portion of the sheet material.

Some implementations include one or more of the following features. The material can be irradiated with ionizing radiation. The dose of ionizing radiation can be at least, for example, 0.10 MRad, e.g., at least 0.25 MRad. The dose of ionizing radiation can be controlled to a level of about 0.25 to about 5 MRad. Irradiating can include irradiating with gamma radiation, and/or with electron beam radiation or other particles. Electrons in the electron beam can have an energy of at least about 0.05 MeV, e.g., from about 0.05 about 10.0 MeV, e.g., from about 0.1 MeV to about 8.0 MeV, or from about 0.25 MeV to about 7.5 MeV.

The methods can further include quenching the irradiated material. For example, quenching can be performed in the presence of a gas selected to react with radicals present in the irradiated material.

In some cases, only a portion of the material is irradiated. In some cases, only a portion of the irradiated area, or only a portion of the material as a whole, is quenched. For example, an area that is to remain unmarked and/or unquenched can be masked.

Irradiation can occur during formation of the sheet material. In some implementations, powders, granulates, chemical solutions, dyes, inks, or gases can be applied, singularly or in combination, before, during, or after formation of the sheet material.

In another aspect, the invention features marked products that include functional groups not normally present in the material from which the marked product was manufactured.

The plastic in the plastic-based sheet material can be, for example, an olefin. Suitable plastics include those selected from the group consisting of polypropylene, polyethylene, polybutene, and mixtures thereof. In some implementations, the plastic may be biaxially oriented polypropylene. In some embodiments metal or inorganic fibers or other metallic materials can also be included with the in a portion of the sheet material being irradiated.

In a further aspect, the invention features a method of identifying whether a product is marked. The method includes comparing the functionalization of a sample product to the functionalization of a marked product.

In some cases, the method includes determining the functionalization of the sample product using infrared spectrometry (IR). The method may include comparing the number of carboxylic acid groups present in the sample product with the number of carboxylic acid groups present in the marked product.

In some cases, the functionalization is determined using atomic force microscopy (AFM), chemical force microscopy (CFM), or electron spin resonance (ESR). Unpaired electrons above background levels can be detected and quantified by ESR by examining the substrate or portion of the substrate.

The irradiated material can also include functional groups selected from the group consisting of aldehyde groups, nitroso groups, nitrile groups, nitro groups, ketone groups, amino groups, alkyl amino groups, alkyl groups, chloroalkyl groups, chlorofluoroalkyl groups, and enol groups.

In any of the methods disclosed herein, radiation may be applied from a device that is in a vault.

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described below. All mentioned publications, patent applications, patents, and other references are incorporated herein by reference in their entirety. In case of conflict, the present specification, including definitions, will control. In addition, the materials, methods and examples are illustrative only and not intended to be limiting.

Other features and advantages of the invention will be apparent from the following detailed description, and from the claims.

DETAILED DESCRIPTION

Figure 1:
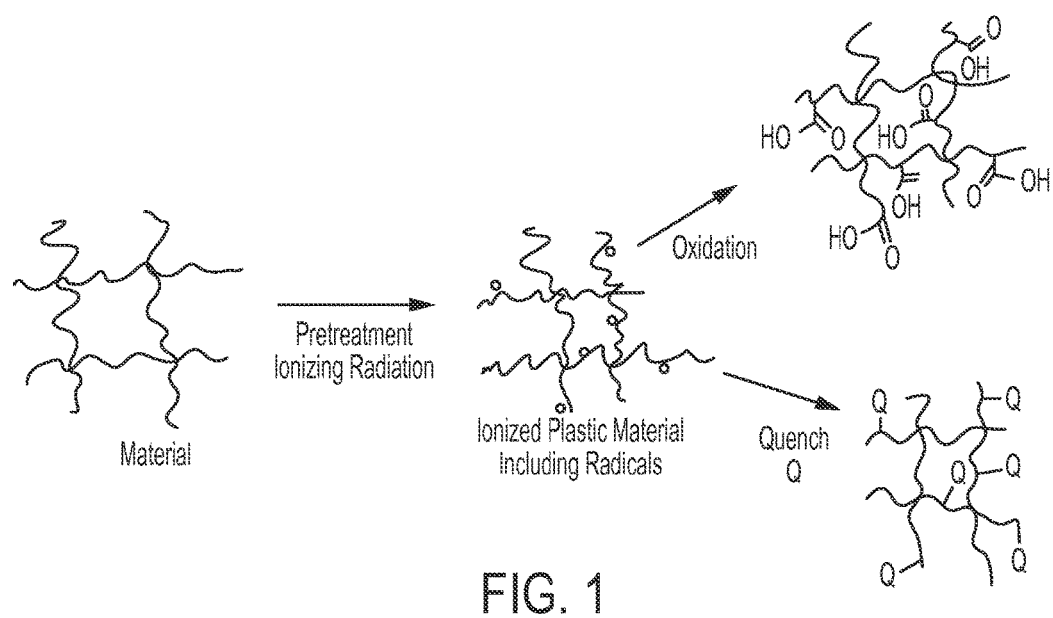
FIG. 1 is a diagram that illustrates changing a molecular and/or a supramolecular structure of a plastic-based material.

As discussed above, plastics-based products can be marked by applying to a plastic substrate a treatment that changes one or more characteristics of the plastic. The change can be, for example, a change in the molecular structure of a treated portion of the substrate or a change in the composition of the treated area (e.g., by ion implantation.)

The change in molecular structure can include a change in any one or more of an average molecular weight, average crystallinity, surface area, polymerization, porosity, branching, grafting, and domain size. These changes in molecular structure can in some cases result in favorable alterations of the physical characteristics exhibited by the fibrous materials. For example, in addition to marking the product, changing the functionalization can also favorably affect the surface properties of the plastic substrate, e.g., the receptivity of the surface to coatings, inks and dyes.

Radiation can be applied at one or more selected stages of the production of the product, including production of the plastic substrate and/or production of intermediate products, as will be discussed in further detail below. Treatment, e.g., irradiation, is generally performed in a controlled and predetermined manner to provide optimal properties for a particular application, by selecting the type or types of radiation employed and/or dose or doses of radiation applied.

Irradiating to Affect Material Functional Groups

After treatment with one or more ionizing radiations, such as photonic radiation (e.g., X-rays or gamma-rays), e-beam radiation or irradiation with particles heavier than electrons that are positively or negatively charged (e.g., protons or carbon ions), the plastic becomes ionized; that is, the plastic includes radicals at levels that are detectable, for example, with an electron spin resonance spectrometer. After ionization, the plastic can be quenched to reduce the level of radicals in the ionized material, e.g., such that the radicals are no longer detectable with the electron spin resonance spectrometer. For example, the radicals can be quenched by the application of sufficient pressure to the ionized material and/or by contacting the ionized material with a fluid, such as a gas or liquid, that reacts with (quenches) the radicals. Various gases, for example nitrogen or oxygen, or liquids, can be used to at least aid in the quenching of the radicals and to functionalize the ionized material with desired functional groups. Thus, irradiation followed by quenching can be used to provide a plastic substrate with desired functional groups, including, for example, one or more of the following: aldehyde groups, enol groups, nitroso groups, nitrile groups, nitro groups, ketone groups, amino groups, alkyl amino groups, alkyl groups, chloroalkyl groups, chlorofluoroalkyl groups, and/or carboxylic acid groups. These groups increase the hydrophilicity of the region of the material where they are present. In some implementations, the substrate is irradiated and quenched, before or after processing steps such as coating and printing, to affect the functionality within and/or at the surface of the substrate and thereby affect the ink receptivity and other properties of the substrate.

FIG. 1 illustrates changing a molecular and/or a supramolecular structure a plastic material by pretreating the material with ionizing radiation, such as with electrons or ions of sufficient energy to ionize the material, to provide a first level of radicals. As shown in FIG. 1, if the ionized material remains in the atmosphere, it will be oxidized, e.g., to an extent that carboxylic acid groups are generated by reaction with the atmospheric oxygen. Since the radicals can "live" for some time after irradiation, e.g., longer than 1 day, 5 days, 30 days, 3 months, 6 months, or even longer than 1 year, material properties can continue to change over time, which in some instances can be undesirable.

Detecting radicals in irradiated samples by electron spin resonance spectroscopy and radical lifetimes in such samples is discussed in Bartolotta et al., Physics in Medicine and Biology, 46 (2001), 461-471 and in Bartolotta et al., Radiation Protection Dosimetry, Vol. 84, Nos. 1-4, pp. 293-296 (1999). As shown in FIG. 1, the ionized material can be quenched to functionalize and/or to stabilize the ionized material.

In some embodiments, quenching includes application of pressure to the ionized material, such as by mechanically deforming the material, e.g., directly mechanically compressing the material in one, two, or three dimensions, or applying pressure to fluid in which the material is immersed, e.g., isostatic pressing. Pressure may be applied, e.g., by passing the material through a nip. In such instances, the deformation of the material itself brings radicals, which are often trapped in crystalline domains, into proximity close enough for the radicals to recombine, or react with another group. In some instances, pressure is applied together with application of heat, e.g. a quantity of heat sufficient to elevate the temperature of the material to above a melting point or softening point of a component of the ionized material, such as lignin, cellulose or hemicellulose. Heat can improve molecular mobility in the material, which can aid in quenching of radicals. When pressure is utilized to quench, the pressure can be greater than about 1000 psi, such as greater than about 1250 psi, 1450 psi, 3625 psi, 5075 psi, 7250 psi, 10000 psi, or even greater than 15000 psi.

In some embodiments, quenching includes contacting the ionized material with fluid, such as liquid or gas, e.g., a gas capable of reacting with the radicals, such as acetylene or a mixture of acetylene in nitrogen, ethylene, chlorinated ethylenes or chlorofluoroethylenes, propylene or mixtures of these gases. In other particular embodiments, quenching includes contacting the ionized material with liquid, e.g., a liquid soluble in, or at least capable of penetrating into, the ionized material and reacting with the radicals, such as a diene, such as 1,5-cyclooctadiene. In some specific embodiments, the quenching includes contacting the ionized material with an antioxidant, such as Vitamin E. If desired, the material can include an antioxidant dispersed therein, and quenching can come from contacting the antioxidant dispersed in the material with the radicals.

Other methods for quenching are possible. For example, any method for quenching radicals in polymeric materials described in Muratoglu et al., U.S. Patent Publication No. 2008/0067724 and Muratoglu et al., U.S. Pat. No. 7,166,650, the disclosures of which are incorporated herein by reference in their entireties, can be utilized for quenching any ionized material described herein. Furthermore, any quenching agent (described as a "sensitizing agent" in the above-noted Muratoglu disclosures) and/or any antioxidant described in either Muratoglu reference, can be utilized to quench any ionized material.

Functionalization can be enhanced by utilizing heavy charged ions. For example, if it is desired to enhance oxidation, charged oxygen ions can be utilized for the irradiation. If nitrogen functional groups are desired, nitrogen ions or any ion that includes nitrogen can be utilized. Likewise, if sulfur or phosphorus groups are desired, sulfur or phosphorus ions can be used in the irradiation.

In some embodiments, after quenching, the quenched material can treated with one or more further doses of radiation, such as ionizing or non-ionizing radiation, and/or can be oxidized for additional molecular and/or supramolecular structure change.

In some embodiments, the fibrous material is irradiated under a blanket of inert gas, e.g., helium or argon, prior to quenching.

The location of the functional groups can be controlled, e.g., by selecting a particular type and dose of ionizing particles. For example, gamma radiation tends to affect the functionality of molecules within the substrate, while electron beam radiation tends to preferentially affect the functionality of molecules at the surface.

In some cases, functionalization of the material can occur simultaneously with irradiation, rather than as a result of a separate quenching step. In this case, the type of functional groups and degree of oxidation can be affected in various ways, for example by controlling the gas blanketing the material to be irradiated, through which the irradiating beam passes. Suitable gases include nitrogen, oxygen, air, ozone, nitrogen dioxide, sulfur dioxide and chlorine.

In some embodiments, functionalization results in formation of enol groups in the plastic material. This can enhance receptivity of the substrate to inks, adhesives, coatings, and the like, and can provide grafting sites.

Ion Implantation

Ion implantation is a process by which ions of a material are accelerated in an electrical field and impacted into a solid. This process is used to change the physical, chemical, or electrical properties of the solid. The ions alter the elemental composition of the target, if the ions differ in composition from the target. They also cause many chemical and physical changes in the target by transferring their energy and momentum to the electrons and atomic nuclei of the target material. This causes a structural change, in that the crystal structure of the target can be damaged or even destroyed. Because the ions have masses comparable to those of the target atoms, they knock the target atoms out of place more than electron beams do. If the ion energy is sufficiently high (usually tens of MeV) there can even be a small amount of nuclear transmutation.

The plastic substrates described herein can be implanted with any desired ions. For example, metals may be used, such as rare earth elements (e.g., gold, silver, iridium, rhodium) and/or other metals that would be useful in marking the substrates.

The implanted materials could be activated, e.g., so as to be detectable with a Geiger counter or other specialized equipment.

Masking

In some cases it may be desirable to treat (e.g., ion implant, irradiate and/or quench) only a small area of a product, e.g., to create a "watermark" or to irradiate a particular symbol printed on the product, e.g., an "E" on currency. In such cases, the remainder of the product, which is to remain unmarked, can be masked.

If only a small portion is to be irradiated, the remainder is masked with a radioopaque material, e.g., lead or other heavy metal. The mask should be of sufficient thickness to prevent radiation from passing through, or to reduce the radiation that passes through sufficiently to prevent marking. If it is desired to mark a particular symbol, such as the E on currency, the product should be in registration with the mask such that the symbol to be marked is lined up with an opening in the mask. Techniques for such masking are well known, e.g., in the semiconductor industry.

If only a small portion is to be quenched, the remainder of the product can be masked during quenching, e.g., with a material that inhibits contact of the product with the liquid or gas used in quenching.

Particle Beam Exposure in Fluids

In some cases, the plastic substrate can be exposed to a particle beam in the presence of one or more additional fluids (e.g., gases and/or liquids). Exposure of a material to a particle beam in the presence of one or more additional fluids can increase the efficiency of the treatment.

In some embodiments, the material is exposed to a particle beam in the presence of a fluid such as air. For example, particles accelerated in an accelerator can be coupled out of the accelerator via an output port (e.g., a thin membrane such as a metal foil), pass through a volume of space occupied by the fluid, and then be incident on the material. In addition to directly treating the material, some of the particles generate additional chemical species by interacting with fluid particles (e.g., ions and/or radicals generated from various constituents of air, such as ozone and oxides of nitrogen). These generated chemical species can also interact with the material. For example, any oxidant produced can oxidize the material.

In certain embodiments, additional fluids can be selectively introduced into the path of a particle beam before the beam is incident on the material. As discussed above, reactions between the particles of the beam and the particles of the introduced fluids can generate additional chemical species, which react with the material and can assist in functionalizing the material, and/or otherwise selectively altering certain properties of the material. The one or more additional fluids can be directed into the path of the beam from a supply tube, for example. The direction and flow rate of the fluid(s) that is/are introduced can be selected according to a desired exposure rate and/or direction to control the efficiency of the overall treatment, including effects that result from both particle-based treatment and effects that are due to the interaction of dynamically generated species from the introduced fluid with the material. In addition to air, exemplary fluids that can be introduced into the ion beam include oxygen, nitrogen, one or more noble gases, one or more halogens, and hydrogen.

Cooling Irradiated Materials

During treatment of the materials discussed above with ionizing radiation, especially at high dose rates, such as at rates greater then 0.15 Mrad per second, e.g., 0.25 Mrad/s, 0.35 Mrad/s, 0.5 Mrad/s, 0.75 Mrad/s or even greater than 1 Mrad/sec, the materials can retain significant quantities of heat so that the temperature of the material becomes elevated. While higher temperatures can, in some embodiments, be advantageous, e.g., when a faster reaction rate is desired, it is advantageous to control the heating to retain control over the chemical reactions initiated by the ionizing radiation, such as crosslinking and/or grafting.

For example, in one method, the material is irradiated at a first temperature with ionizing radiation, such as photons, electrons or ions (e.g., singularly or multiply charged cations or anions), for a sufficient time and/or a sufficient dose to elevate the material to a second temperature higher than the first temperature. The irradiated material is then cooled to a third temperature below the second temperature. If desired, the cooled material can be treated one or more times with radiation, e.g., with ionizing radiation. If desired, cooling can be applied to the material after and/or during each radiation treatment.

Cooling can in some cases include contacting the material with a fluid, such as a gas, at a temperature below the first or second temperature, such as gaseous nitrogen at or about 77 K. Even water, such as water at a temperature below nominal room temperature (e.g., 25 degrees Celsius) can be utilized in some implementations.

Types of Radiation

The radiation can be provided, e.g., by: 1) heavy charged particles, such as alpha particles; 2) electrons, produced, for example, in beta decay or electron beam accelerators; or 3) electromagnetic radiation, e.g., gamma rays, x-rays or ultraviolet rays. Different forms of radiation ionize the cellulosic or lignocellulosic material via particular interactions, as determined by the energy of the radiation.

Heavy charged particles include alpha particles, which are identical to the nucleus of a helium atom and are produced by alpha decay of various radioactive nuclei, such as isotopes of bismuth, polonium, astatine, radon, francium, radium, several actinides, such as actinium, thorium, uranium, neptunium, curium, californium, americium and plutonium.

Electrons interact via Coulomb scattering and bremsstrahlung radiation produced by changes in the velocity of electrons. Electrons can be produced by radioactive nuclei that undergo beta decay, such as isotopes of iodine, cesium, technetium and iridium. Alternatively, an electron gun can be used as an electron source via thermionic emission.

Electromagnetic radiation interacts via three processes: photoelectric absorption, Compton scattering and pair production. The dominating interaction is determined by the energy of incident radiation and the atomic number of the material. The summation of interactions contributing to the absorbed radiation in cellulosic material can be expressed by the mass absorption coefficient.

Electromagnetic radiation is subclassified as gamma rays, x-rays, ultraviolet rays, infrared rays, microwaves or radio waves, depending on its wavelength.

Figure 2:
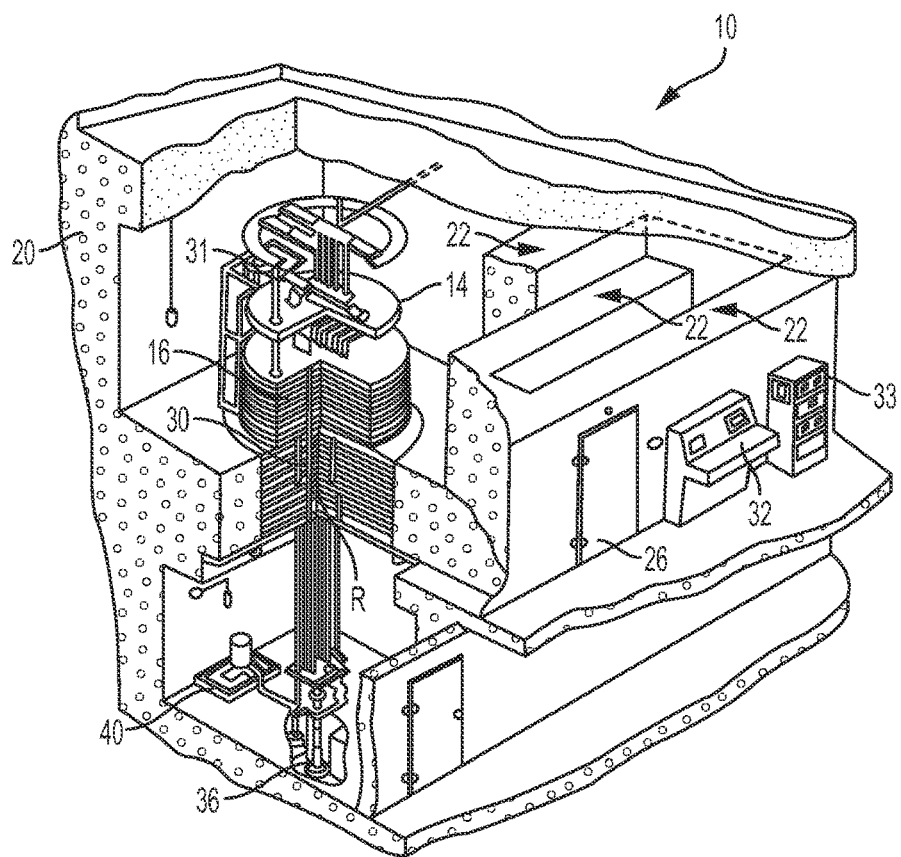
FIG. 2 is a perspective, cut-away view of a gamma irradiator housed in a concrete vault.
Figure 3:
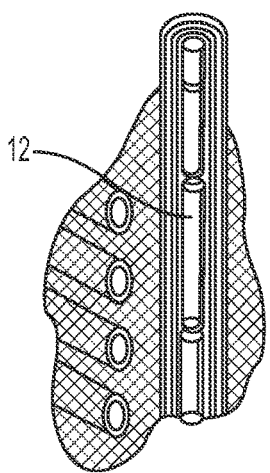
FIG. 3 is an enlarged perspective view of region R of FIG. 2.

Referring to FIGS. 2 and 3 (an enlarged view of region R), gamma radiation can be provided by a gamma irradiator 10 that includes gamma radiation sources 408, e.g., $^{60}Co$ pellets, a working table 14 for holding the materials to be irradiated, and storage 16, e.g., made of a plurality iron plates. All of these components are housed in a concrete containment chamber (vault) 20 that includes a maze entranceway 22 beyond a lead-lined door 26. Storage 16 defines a plurality of channels 30, e.g., sixteen or more channels, allowing the gamma radiation sources to pass through storage on their way proximate the working table.

In operation, the sample to be irradiated is placed on a working table. The irradiator is configured to deliver the desired dose rate and monitoring equipment is connected to an experimental block 31. The operator then leaves the containment chamber, passing through the maze entranceway and through the lead-lined door. The operator mans a control panel 32, instructing a computer 33 to lift the radiation sources 12 into working position using cylinder 36 attached to hydraulic pump 40.

Gamma radiation has the advantage of significant penetration depth. Sources of gamma rays include radioactive nuclei, such as isotopes of cobalt, calcium, technicium, chromium, gallium, indium, iodine, iron, krypton, samarium, selenium, sodium, thalium and xenon.

Sources of x-rays include electron beam collision with metal targets, such as tungsten or molybdenum or alloys, or compact light sources, such as those produced commercially by Lyncean Technologies, Inc., of Palo Alto, Calif.

Sources for ultraviolet radiation include deuterium or cadmium lamps.

Sources for infrared radiation include sapphire, zinc or selenide window ceramic lamps.

Sources for microwaves include klystrons, Slevin type RF sources or atom beam sources that employ hydrogen, oxygen or nitrogen gases.

In some embodiments, a beam of electrons is used as the radiation source. A beam of electrons has the advantages of high dose rates (e.g., 1, 5, or even 10 MRad per second), high throughput, less containment and less confinement equipment. Electrons can also be more efficient at causing chain scission. In addition, electrons having energies of 4-10 MeV can have penetration depths of 5 to 30 mm or more, such as 40 mm.

Electron beams can be generated, e.g., by electrostatic generators, cascade generators, transformer generators, low energy accelerators with a scanning system, low energy accelerators with a linear cathode, linear accelerators, and pulsed accelerators. Electrons as an ionizing radiation source can be useful, e.g., for relatively thin materials, e.g., less than 0.5 inch, e.g., less than 0.4 inch, 0.3 inch, 0.2 inch, or less than 0.1 inch. In some embodiments, the energy of each electron of the electron beam is from about 0.25 MeV to about 7.5 MeV (million electron volts), e.g., from about 0.5 MeV to about 5.0 MeV, or from about 0.7 MeV to about 2.0 MeV. Electron beam irradiation devices may be procured commercially from Ion Beam Applications, Louvain-la-Neuve, Belgium or from Titan Corporation, San Diego, Calif. Typical electron energies can be 1, 2, 4.5, 7.5, or 10 MeV. Typical electron beam irradiation device power can be 1, 5, 10, 20, 50, 100, 250, or 500 kW. Typical doses may take values of 1, 5, 10, 20, 50, 100, or 200 kGy.

Tradeoffs in considering electron beam irradiation device power specifications include operating costs, capital costs, depreciation and device footprint. Tradeoffs in considering exposure dose levels of electron beam irradiation would be energy costs and environment, safety, and health (ESH) concerns. Generators are typically housed in a vault, e.g., of lead or concrete.

The electron beam irradiation device can produce either a fixed beam or a scanning beam. A scanning beam may be advantageous with large scan sweep length and high scan speeds, as this would effectively replace a large, fixed beam width. Further, available sweep widths of 0.5 m, 1 m, 2 m or more are available.

In embodiments in which the irradiating is performed with electromagnetic radiation, the electromagnetic radiation can have an energy per photon (in electron volts) of, e.g., greater than $10^2$ eV, e.g., greater than $10^3$, $10^4$, $10^5$, $10^6$ or even greater than $10^7$ eV. In some embodiments, the electromagnetic radiation has energy per photon of between $10^4$ and $10^7$, e.g., between $10^5$ and $10^6$ eV. The electromagnetic radiation can have a frequency of, e.g., greater than $10^{16}$ hz, greater than $10^{17}$ hz, $10^{18}$, $10^{19}$, $10^{20}$ or even greater than $10^{21}$ hz. In some embodiments, the electromagnetic radiation has a frequency of between $10^{18}$ and $10^{22}$ hz, e.g., between $10^{19}$ to $10^{21}$ hz.

Figure 4:
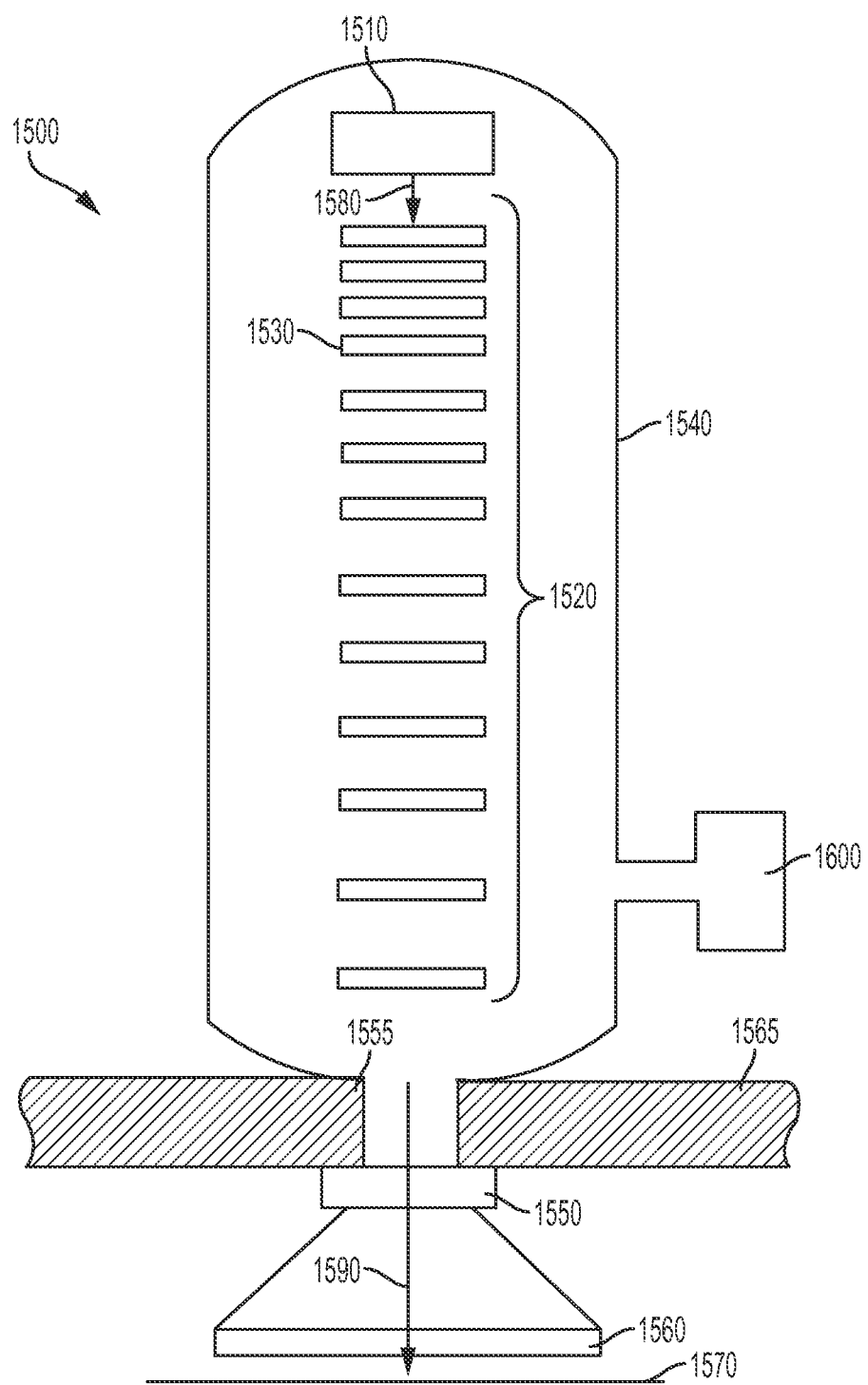
FIG. 4 is a schematic diagram of a DC accelerator.

One type of accelerator that can be used to accelerate ions produced using the sources discussed above is a Dynamitron® (available, for example, from Radiation Dynamics Inc., now a unit of IBA, Louvain-la-Neuve, Belgium). A schematic diagram of a Dynamitron® accelerator 1500 is shown in FIG. 4. Accelerator 1500 includes an injector 1510 (which includes an ion source) and an accelerating column 1520 that includes a plurality of annular electrodes 1530. Injector 1510 and column 1520 are housed within an enclosure 1540 that is evacuated by a vacuum pump 1600.

Injector 1510 produces a beam of ions 1580, and introduces beam 1580 into accelerating column 1520. The annular electrodes 1530 are maintained at different electric potentials, so that ions are accelerated as they pass through gaps between the electrodes (e.g., the ions are accelerated in the gaps, but not within the electrodes, where the electric potentials are uniform). As the ions travel from the top of column 1520 toward the bottom in FIG. 4, the average speed of the ions increases. The spacing between subsequent annular electrodes 1530 typically increases, therefore, to accommodate the higher average ion speed.

After the accelerated ions have traversed the length of column 1520, the accelerated ion beam 1590 is coupled out of enclosure 1540 through delivery tube 1555. The length of delivery tube 1555 is selected to permit adequate shielding (e.g., concrete shielding) to be positioned adjacent to column 1520, isolating the column. After passing through tube 1555, ion beam 1590 passes through scan magnet 1550. Scan magnet 1550, which is controlled by an external logic unit (not shown), can sweep accelerated ion beam 1590 in a controlled fashion across a two-dimensional plane oriented perpendicular to a central axis of column 1520. As shown in FIG. 4, ion beam 1590 passes through window 1560 (e.g., a metal foil window or screen) and then is directed to impinge on selected regions of a sample 1570 by scan magnet 1550.

In some embodiments, the electric potentials applied to electrodes 1530 are static potentials, generated, e.g., by DC potential sources. In certain embodiments, some or all of the electric potentials applied to electrodes 1530 are variable potentials generated by variable potential sources. Suitable variable sources of large electric potentials include amplified field sources, e.g. such as klystrons. Accordingly, depending upon the nature of the potentials applied to electrodes 1530, accelerator 1500 can operate in either pulsed or continuous mode.

To achieve a selected accelerated ion energy at the output end of column 1520, the length of column 1520 and the potentials applied to electrodes 1530 are chosen based on considerations well-known in the art. However, it is notable that to reduce the length of column 1520, multiply-charged ions can be used in place of singly-charged ions. That is, the accelerating effect of a selected electric potential difference between two electrodes is greater for an ion bearing a charge of magnitude 2 or more than for an ion bearing a charge of magnitude 1. Thus, an arbitrary ion $X^{2+}$ can be accelerated to final energy E over a shorter length than a corresponding arbitrary ion X. Triply- and quadruply-charged ions (e.g., $X^{3+}$ and $X^{4+}$) can be accelerated to final energy E over even shorter distances. Therefore, the length of column 1520 can be significantly reduced when ion beam 1580 includes primarily multiply-charged ion species.

To accelerate positively-charged ions, the potential differences between electrodes 1530 of column 1520 are selected so that the direction of increasing field strength in FIG. 4 is downward (e.g., toward the bottom of column 1520). Conversely, when accelerator 1500 is used to accelerate negatively-charged ions, the electric potential differences between electrodes 1530 are reversed in column 1520, and the direction of increasing field strength in FIG. 4 is upward (e.g., toward the top of column 1520). Reconfiguring the electric potentials applied to electrodes 1530 is a straightforward procedure, so that accelerator 1500 can be converted relatively rapidly from accelerating positive ions to accelerating negative ions, or vice versa. Similarly, accelerator 1500 can be converted rapidly from accelerating singly-charged ions to accelerating multiply-charged ions, and vice versa.

Various methods may be used for the generation of ions suitable for use in ion beams to be used in treating the substrate. After the ions have been generated, they are typically accelerated in one or more of various types of accelerators, and then directed to impinge on the material to be treated. Various types of accelerators and ion beam generating equipment are described in U.S. Ser. No. 12/417,707, incorporated by reference hereinabove.

Doses

In some embodiments, irradiating (with any radiation source or a combination of sources) is performed until the material receives a dose of at least 0.05 MRad, e.g., at least 0.1, 0.25, 1.0, 2.5, or 5.0 MRad. In some embodiments, irradiating is performed until the material receives a dose of between 0.1 and 2.5 MRad. Other suitable ranges include between 0.25 MRad and 4.0 MRad, between 0.5 MRad and 3.0 MRad, and between 1.0 MRad and 2.5 MRad.

The degree of change of the characteristics of the substrate achieved is generally higher the higher the dose.

In some embodiments, the irradiating is performed at a dose rate of between 5.0 and 1500.0 kilorads/hour, e.g., between 10.0 and 750.0 kilorads/hour or between 50.0 and 350.0 kilorads/hours. When high throughput is desired radiation can be applied at, e.g., 0.5 to 3.0 MRad/sec, or even faster, using cooling to avoid overheating the irradiated material.

In some embodiments in which a coated substrate is irradiated, the coating includes resin that is cross-linkable, e.g., diacrylate or polyethylene. In some cases, the resin crosslinks as the substrate is irradiated, which can provide a synergistic effect to optimize the scuff resistance and other surface properties of the substrate. In these embodiments, the dose of radiation is selected to be sufficiently high so as to achieve the desired functionalization, i.e., at least about 0.25 to about 2.5 MRad, depending on the material, while being sufficiently low so as to avoid deleteriously affecting the coating. The upper limit on the dose will vary depending on the composition of the coating, but in some embodiments the preferred dose is less than about 5 MRad.

In some embodiments, two or more radiation sources are used, such as two or more ionizing radiations. For example, samples can be treated, in any order, with a beam of electrons, followed by gamma radiation and/or UV light having wavelengths from about 100 nm to about 280 nm. In some embodiments, samples are treated with three ionizing radiation sources, such as a beam of electrons, gamma radiation, and energetic UV light.

Identifying Marked Products

Products that have been marked using the methods described herein are distinguishable from similar looking unmarked products by determining the functionality of the marked plastic. This can be accomplished, for example, by preparing an IR scan of the plastic in question, using an infrared spectrometer, and comparing the scan to a "control" IR scan of a marked plastic. For example, if the marked plastic has been by functionalized so as to increase the number of carboxylic acid groups in the plastic, the IR scan of a plastic being tested to see whether it has been similarly marked should have a carboxyl peak that is substantially the same height as the carboxyl peak in the control IR scan.

Alternative methods of testing whether a plastic has been marked or not include AFM, CFM, and ESR.

Polymer Banknotes

As discussed above, one type of plastic-based product that can be marked using the processes described herein is a polymeric banknote. Such banknotes are often formed from biaxially oriented polypropylene (BOPP.) To form banknotes, a BOPP substrate is processed through the following steps:

Opacifying—two layers of ink (usually white) are applied to each side of the note, except for an area(s) deliberately left clear;

Sheeting—the substrate is cut into sheets suitable for the printing press;

Printing—traditional offset, intaglio, and letterpress processes are often used; and Overcoating—notes are coated with a protective varnish.

The notes may be marked prior to, during, or after any of these steps.

Polymer-based Laminates

Polymer-based laminates are often used in the manufacture of credit cards, identification cards, and the like. Such laminates are described, for example, in EP 0987121, and may include a core layer, a cover layer on at least one side of the core layer, and an adhesive layer laminating the cover layer to the core layer. Such laminates, and/or products made with such laminates, can be marked at any stage of manufacture. For example, the cover layer and/or core layer can be marked prior to assembly into the laminate, the laminate may be marked prior to formation of the product, or the product may be marked.

Additives

Any of the many additives and coatings used in the plastics industry can be added to or applied to the materials described herein. Additives include fillers such as calcium carbonate, plastic pigments, graphite, wollastonite, mica, glass, fiber glass, silica, and talc; inorganic flame retardants such as alumina trihydrate or magnesium hydroxide; organic flame retardants such as chlorinated or brominated organic compounds; carbon fibers; and metal fibers or powders (e.g., aluminum, stainless steel). These additives can reinforce, extend, or change electrical or mechanical properties, compatibility properties, or other properties. Other additives include starch, lignin, fragrances, coupling agents, antioxidants, opacifiers, heat stabilizers, colorants such as dyes and pigments, other polymers, e.g., degradable polymers, photostabilizers, and biocides. Representative degradable polymers include polyhydroxy acids, e.g., polylactides, polyglycolides and copolymers of lactic acid and glycolic acid, poly(hydroxybutyric acid), poly(hydroxyvaleric acid), poly[lactide-co-(e-caprolactone)], poly[glycolide-co-(e-caprolactone)], polycarbonates, poly(amino acids), poly(hydroxyalkanoate)s, polyanhydrides, polyorthoesters and blends of these polymers.

Additives additionally include cellulosic or lignocellulosic material, e.g., cellulosic or lignocellulosic fibrous material. The cellulosic or lignocellulosic material can be selected from any desired type of fiber or mixtures thereof, including fiber derived from wood and vegetable fiber materials, such as cotton, hemp, linen, rice, sugarcane, bagasse, straw, bamboo, kenaf, jute, flax, recycled paper material, such as corrugated cardboard, paper board, books, magazines, newspapers, paper bags, envelopes, boxes, and other paper products, as well as fiber derived from other sources. In some embodiments, the cellulosic or lignocellulosic material may contain functional groups not present in a naturally occurring cellulosic or lignocellulosic material. In some embodiments, the cellulosic or lignocellulosic fibrous material may form part of a polymer-based laminate, as described above.

If desired, various cross-linking additives can be added. Such additives include materials that are cross-linkable themselves and materials that will assist with cross-linking of the plastic materials. Cross-linking additives include, but are not limited to, lignin, starch, diacrylates, divinyl compounds, and polyethylene. In some implementations, such additives are included in concentrations of about 0.25% to about 2.5%, e.g., about 0.5% to about 1.0%.

When additives are included, they can be present in amounts, calculated on a dry weight basis, of from below about 1 percent to as high as about 80 percent, based on total weight of the fibrous material. More typically, amounts range from between about 0.5 percent to about 50 percent by weight, e.g., from about 0.5 percent to about 5 percent, 10 percent, 20 percent, 30, percent or more, e.g., 40 percent.

Any additives described herein can be encapsulated, e.g., spray dried or microencapsulated, e.g., to protect the additives from heat or moisture during handling.

As mentioned above, various fillers can be included in the plastic. For example, inorganic fillers such as calcium carbonate (e.g., precipitated calcium carbonate or natural calcium carbonate), aragonite clay, orthorhombic clays, calcite clay, rhombohedral clays, kaolin clay, bentonite clay, dicalcium phosphate, tricalcium phosphate, calcium pyrophosphate, insoluble sodium metaphosphate, precipitated calcium carbonate, magnesium orthophosphate, trimagnesium phosphate, hydroxyapatites, synthetic apatites, alumina, silica xerogel, metal aluminosilicate complexes, sodium aluminum silicates, zirconium silicate, silicon dioxide or combinations of the inorganic additives may be used. The fillers can have, e.g., a particle size of greater than 1 micron, e.g., greater than 2, 5, 10, or 25 microns or even greater than 35 microns.

Nanometer scale fillers can also be used alone, or in combination with fibrous materials of any size and/or shape. The fillers can be in the form of, e.g., particles, plates or fibers. For example, nanometer sized clays, silicon and carbon nanotubes, and silicon and carbon nanowires can be used. The fillers can have a transverse dimension less than 1000 nm, e.g., less than 900, 800, 750, 600, 500, 350, 300, 250, 200, or 100 nm, or even less than 50 nm.

In some embodiments, the nano-clay is a montmorillonite. Such clays are available from Nanocor, Inc. and Southern Clay products, and have been described in U.S. Pat. Nos. 6,849,680 and 6,737,464. The clays can be surface treated before mixing into, e.g., a resin or a fibrous material. For example, the clay can be surface treated so that its surface is ionic in nature, e.g., cationic or anionic.

Aggregated or agglomerated nanometer scale fillers, or nanometer scale fillers that are assembled into supramolecular structures, e.g., self-assembled supramolecular structures can also be used. The aggregated or supramolecular fillers can be open or closed in structure, and can have a variety of shapes, e.g., cage, tube or spherical.

OTHER EMBODIMENTS

It is to be understood that while the invention has been described in conjunction with the detailed description thereof, the foregoing description is intended to illustrate and not limit the scope of the invention, which is defined by the scope of the appended claims. Other aspects, advantages, and modifications are within the scope of the following claims.

What is claimed is:

1. A method of making a marked plastic-based product, the method comprising
    irradiating an exposed surface of a plastic sheet material with at least 0.10 MRad of ionizing radiation under conditions selected to alter the characteristics of at least an area of the exposed surface of the substrate, the exposed surface consisting essentially of plastic; and
    before or after irradiating, utilizing the sheet material to produce the plastic-based product, wherein the product is selected from the group consisting of polymer banknotes, identification cards, passports and credit cards.

2. The method of claim 1 wherein the dose of ionizing radiation is at least 0.25 MRad.

3. The method of claim 1 wherein irradiating comprises irradiating with electron beam radiation.

4. The method of claim 3 wherein the electron beam has an energy of at least 0.25 MeV.

5. The method of claim 1 wherein irradiating is performed under conditions selected to increase the number of carboxylic acid groups present in the substrate.

6. The method of claim 1 further comprising quenching the irradiated substrate.

7. The method of claim 6 wherein quenching is performed in the presence of a gas selected to react with radicals present in the irradiated substrate.

8. The method of claim 1 wherein only a portion of the substrate is irradiated.

9. The method of claim 6 wherein only a portion of the substrate is quenched.

10. The method of claim 1 wherein the substrate comprises an olefin.

11. The method of claim 10 wherein the olefin comprises biaxially oriented polypropylene.

* * * * *